United States Patent [19]

Schoolar

[11] 3,793,070

[45] Feb. 19, 1974

[54] METHOD OF VARYING THE CARRIER CONCENTRATION OF LEAD-TIN SULFIDE EPITAXIAL FILMS

[75] Inventor: Richard B. Schoolar, Silver Spring, Md.

[73] Assignee: The United States of America as represented by the Secretary of the Navy, Washington, D.C.

[22] Filed: June 1, 1971

[21] Appl. No.: 152,463

[52] U.S. Cl. .............. 117/201, 148/175, 117/106 R
[51] Int. Cl. ............................................ H01l 7/36
[58] Field of Search . 148/175; 117/106 R, 201, 200

[56] References Cited

UNITED STATES PATENTS

| | | | |
|---|---|---|---|
| 3,520,741 | 7/1970 | Mankarious | 148/175 |
| 3,642,529 | 2/1972 | Lee et al. | 117/106 R |

OTHER PUBLICATIONS

Schoolar et al., Journal of Applied Physics, Vol. 35, No. 6, June 1964, pp. 1,848–1,851.

Bis et al., Journal of Applied Physics, Vol. 37, No. 1, 1966, pp. 228–230.

*Primary Examiner*—Benjamin R. Padgett
*Attorney, Agent, or Firm*—R. S. Sciascia; J. A. Cooke; M. G. Berger

[57] ABSTRACT

A method of varying the carrier concentration of epitaxial films of $Pb_x Sn_{1-x}S$, wherein X varies from 0.8 to 1 inclusive, which are deposited in vacuum from a source of material in a sublimation furnace which is at a temperature above the sublimation temperature of the material comprising varying the sublimation furnace opening size and temperature. The products can be used as infrared detectors.

15 Claims, 1 Drawing Figure

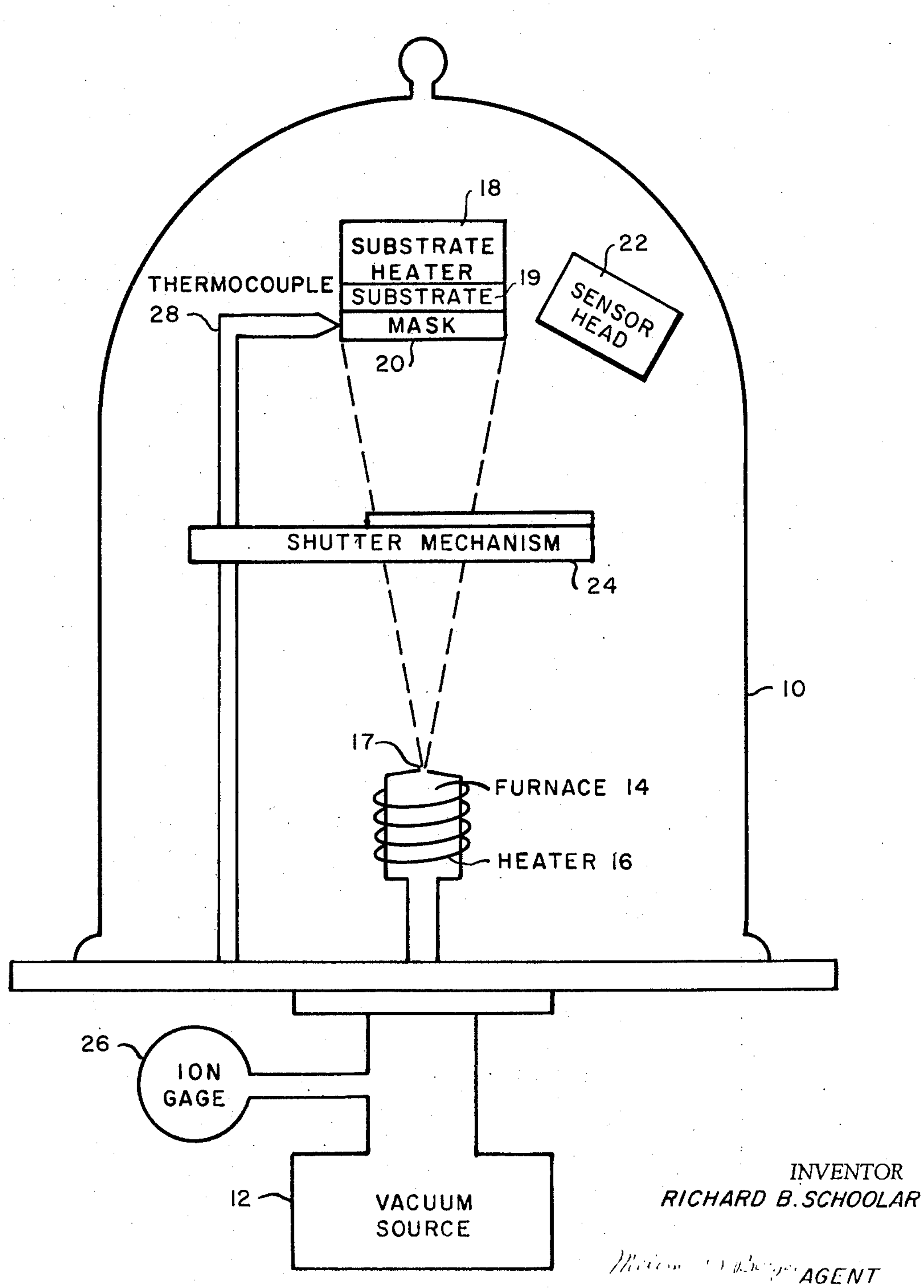
INVENTOR
RICHARD B. SCHOOLAR
BY [signature] AGENT
[signature]
ATTORNEY

METHOD OF VARYING THE CARRIER CONCENTRATION OF LEAD-TIN SULFIDE EPITAXIAL FILMS

BACKGROUND OF THE INVENTION

This invention generally relates to a method of preparing epitaxial films for use as photoconductive infrared detectors and more particularly to lead-tin sulfide epitaxial films which can be used as photoconductive infrared detectors. Additionally this invention relates to a simplified method of varying the conductivity type and carrier concentration of the semiconductor material being epitaxially deposited.

Polycrystalline PbS and PbSe films have been used as infrared detectors for anumber of years. These detectors must be baked in sulfur or oxygen to become photosensitive. The mechanism of photosensitivity in these detectors is complex and has never been clearly resolved. Although they can be made very sensitive, their response is non-uniform over the detector area and they have a slow response time, $\tau > 400$ u sec.

Epitaxial lead salt films can also be made photosensitive by baking in oxygen or sulfur vapor. However, they too exhibit non-uniform response. This non-uniformity creates serious problems when these materials are used to fabricate multi-element detector arrays because each element may have a different sensitivity.

U.S. Pat. No. 3,520,741 by Mankarious issued July 14, 1970 and application Ser. No. 24,983 filed Apr. 2, 1970, now U.S. Pat. No. 3,716,424, entitled "LEAD SULFIDE PN JUNCTION DIODES AND METHOD OF PREPARATION THEREOF" by Richard B. Schoolar both disclose methods by which one can grow epitaxial films which can be made either p type, n type or intrinsic by the use of ion implantation or by varying the concentration of vapors of a dopant material in the deposition system. However the methods therein disclosed tend to be rather cumbersome and require a great deal of effort to bring about the desired result. They are especially difficult to use if one wishes to obtain epitaxial layer with very low carrier concentration since the methods disclosed therein are primarily interested in producing junction devices.

Thus, research has gone on for detectors which are very sensitive, easily prepared, uniform throughout their entire volume and which have a relatively rapid response.

SUMMARY OF THE INVENTION

Accordingly one object of this invention is to provide lead-tin sulfide epitaxial films.

Another object of this invention is to provide lead-tin sulfide epitaxial films which can be used as photoconductive infrared detectors.

A further object of this invention is to provide lead-tin sulfide epitaxial films which have a relatively low carrier concentration.

A still further object of this invention is to provide lead-tin sulfide epitaxial films which can be used as photoconductive infrared detectors which have a relatively rapid response.

Another object of this invention is to provide lead-tin sulfide epitaxial films which can be used as photoconductive infrared detectors which are relatively sensitive.

A still further object of this invention is to provide lead-tin sulfide epitaxial films which can be used as photo-conductive infrared detectors which have a relatively uniform composition over the detector area.

A still further object of this invention is to provide a method for the preparation of lead-tin sulfide epitaxial films with the properties hereinbefore enumerated.

Another object of this invention is to provide a relatively simple method by which the composition of epitaxial semiconductor films can be easily varied to make them less n type (more p type) or less p type (more n type) in character.

These and other objects of this invention are accomplished by providing epitaxial films of the composition $Pb_x Sn_{1-x}S$, wherein X varies from 0 to 1 inclusive which are prepared by subliming, in vacuum, the material to be epitaxially deposited and by adjusting the carrier concentration (p; n or intrinsic character) of the material being epitaxially deposited by increasing or decreasing the temperature of the furnace in which the material to be epitaxially deposited is sublimed with or without changing the size of the furnace opening.

BRIEF DESCRIPTION OF THE DRAWING

Other objects and many of the attendant advantages of the present invention will be readily appreciated as the same becomes better understood by reference to the following detailed description when considered in connection with the accompanying drawing.

The solitary FIGURE is a schematic diagram of the apparatus in which the process of this invention is carried out.

DESCRIPTION OF THE PREFERRED EMBODIMENT

Referring now in greater detail to the drawing, the apparatus used in the process of this invention includes a bell jar 10 which is connected to any standard vacuum source 12. Disposed within bell jar 10 is a furnace 14, in which the material to be sublimed is placed, and a heater coil 16, which may be made of any suitable material, such as, for example, nichrome or molybdenum. The nature of the furance is not limited to that disclosed herein but may also be a flash evaporation, induction heating or electron bombardment type furnace. The furnace also has an adjustable opening 17 which is used to regulate the amount of vapor which is deposited. The substrate 19 is placed in a substrate heater 18 which has a mask 20 interposed between the substrate and furnace 14. The film thickness is measured by a deposition rate sensor head 22. A movable shutter mechanism 24 is interposed between mask 20 and furnace 14. An ion gage 26 is provided to measure the total pressure in the apparatus. Additionally, a thermocouple 28 is used to measure the temperature of the substrate.

When an epitaxially grown n-type $Pb_xSn_{1-x}S$ layer is desired one merely places slightly lead or tin rich $Pb_xSn_{1-x}S$ material of the desired composition into furnace 14, evacuates the bell jar to below $5 \times 10^{-5}$ Torr and heats furnace 14 by means of coil 16 to a temperature sufficiently high to produce an appreciable vapor pressure of this material. Deposition onto the substrate 19 is affected by moving shutter 24 so as to allow the vapors to pass through the shutter opening to the substrate. The substrate is a freshly cleaned crystal of NaCl maintained at 200°–350°C during deposition. One will obtain n-type deposition under the standard conditions of operation as disclosed in application Ser. No. 24,983 hereinbefore referred to and hereby incorporated by reference, when the orifice of the furnace is fully open. As one raises the temperature of the sublimation furnace, one obtains a film which is less and less n-type in character until the point is reached at which the epitaxial film being obtained has an extremely low carrier concentration and hence has the desirable properties hereinbefore noted. At this point, the only appreciable carrier concentration is the intrinsic carrier concentration of the material. Furthermore, as the temperature is again raised, one actually obtains deposition of p-type material. Although it is not necessary to vary the size of the orifice in the sublimation furnace, it is desirable to constrict the opening as the temperature of the furnace is raised so that the rate of deposition remains relatively constant and less than 500 A/min since growth rates of 500 A/min or greater are undesirable.

When one starts out with a p-type material in the sublimation furnace at a temperature above the sublimation temperature of the material to be deposited, one obtains p-type deposition and as the temperature of the furnace is raised one obtains more p-type epitaxial films. Conversely as the temperature is lowered, one obtains a film of less and less p-type character although it is not possible to obtain an intrinsic carrier film in this manner nor an n-type film. As with the deposition from n-type material it is not necessary, but it is desirable, to increase the orifice of the furnace as the temperature of the sublimation furnace is decreased and to decrease the orifice of the sublimation furnace as the temperature of it is increased in order to obtain similar rates of deposition.

The theory underlying the instant process with respect to the desirability of obtaining low carrier concentration products to use as infrared detectors is as follows:

The responsitivity of a detector defined as the ratio of detector signal to incident radiant power, is a measure of sensitivity. The responsitivity R of a photoconductive detector, is given by $R = V \eta \tau / 4 \text{ N d E}\lambda \text{ A}$ where V is the applied bias, $\eta$ is the quantum efficiency, $\tau$ is the photoexcited carrier lifetime, N is the carrier concentration of the sample, $d$ is the sample thickness, E $\lambda$ is the incident photon energy, and A is the sample area. One can see from this equation that R is inversely proportional to N. The carrier concentration, N, of the lead and lead-tin sulfide salt semiconductor is a function of chemical stoichemetry. For example, in the compound semiconductor PbS each Pb vacancy gives rise to one positive carrier (hole) and each S vacancy produces one free electron. Thus the lowest carrier concentration would occur in a PbS crystal with a ratio of Pb to S vacancy of 1.0000 (neglecting the effect of impurities) and it is therefore desirable to obtain films which have as low a deviation in stoichemetry as possible. Films which have this perfect stoichemetry are intrinsic. (i.e., lowest possible carrier concentration).

The general nature of the invention having been set forth, the following examples are presented as specific illustrations thereof. It will be understood that the invention is not limited to these specific examples but is susceptible to various modifications that will be recognized by one of ordinary skill in the art.

EXAMPLE 1

The apparatus of the drawing was used to prepare an epitaxial film. The distance from the opening of the sublimation furnace to the substrate was 10 cm. The temperature of the substrate was 260°C ± 10°C; the furnace opening was 5.5 mm; the power output to the sublimation furnace was 4 volts, 6 amps or 24 watts. The sublimation material was slightly lead rich PbS. The pressure of the system was about $1 \times 10^{-5}$ Torr. Under these conditions the rate of film growth was 290 A/min and the film was n-type with $n = 8 \times 10^{17}$ cm$^{-3}$.

EXAMPLE 2

The conditions were exactly the same as in example 1 except that the furnace opening was decreased to 1.0 mm and the power was increased to 33 watts. A growth rate of 125 A/min was obtained and the resulting film was p type with $N = 4 \times 10^{16}$ cm$^{-3}$.

EXAMPLE 3

The same procedure was used as in example 2 and a product was obtained which was p-type with $N = 3 \times 10^{16}$ cm$^{-3}$.

Using the method of this invention, it is possible to obtain n or p type films with carrier concentration between $1 \times 10^{18}$ and intrinsic carriers. Such films can be used as infrared detectors.

It should be noted that when an n-type material is placed in the sublimation furnace and heated in accordance with this invention it actually loses sulfur and tends to become more n-type. Thus one may use the same change for several depositions but it should be realized that the chemical composition of the material to be sublimed does change with use.

EXAMPLE 4

Infrared detectors were prepared by attaching electrical leads to the PbS film products prepared in Examples 2 and 3. The Pbs films were cleaved into many smaller samples which were about 1mm × 2mm in area. Electrical connection was made by evaporating gold pads onto two ends of each sample and attaching fine (0.001 inch dia.) copper wire with silver paint. The detectors were tested using a modified Infrared Industries detector test set and an infrared spectrometer. Their detectivity and response times were both excellent. When operated in a photoconductive mode with a bias of 1 volt their detectivities ($D^*\lambda_p$) are $1 \times 10^8$cm $H_z^{1/2}$ $W^{-1}$ at 297°K and $6 \times 10^{10}$ cm $H_z^{1/2}$ $W^{-1}$ at 77°K respectively. Their response times are on the order of 1 u sec at 297°K and 50 u sec at 77°K. They are photosensitive in the spectral region between 1.5 and 3.0 microns at 297°K and 1.5 and 4.2 microns at 77°K.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A method of varying the carrier concentration of epitaxial films of $Pb_x Sn_{1-x} S$, wherein X varies between 0.8 and 1 inclusive which is deposited onto a substrate which is at a temperature between 200°–350°C in vacuum of at least $5 \times 10^{-5}$ Torr from a source of material which is at a temperature above its sublimation temperature comprising varying the temperature of the material being sublimed provided that said temperature is always kept above the sublimation temperature.

2. The method of claim 1 wherein the material being sublimed is sublimed from a sublimation furnace which has a vapor outlet.

3. The method of claim 2 wherein the diameter of the vapor path is increased as the temperature of the material being sublimed decreased and the diameter of the vapor path is decreased as the temperature of the material being sublimed is increased.

4. The process of claim 1 wherein the material to be sublimed is an n-type material and the epitaxial film is made more p-type by raising the temperature of the material being sublimed.

5. The process of claim 2 wherein the material to be sublimed is an n-type material and the epitaxial film is made more p-type by raising the temperature of the material being sublimed.

6. The process of claim 3 wherein the material to be sublimed is an n-type material and the epitaxial film is made more p-type by raising the temperature of the material being sublimed.

7. The process of claim 1 wherein the material to be sublimed is a p-type material and the epitaxial film is made more p-type by raising the temperature of the material being sublimed.

8. The process of claim 2 wherein the material to be sublimed is a p-type material and the epitaxial film is made more p-type by raising the temperature of the material being sublimed.

9. The process of claim 3 wherein the material to be sublimed is a p-type material and the epitaxial film is made more p-type by raising the temperature of the material being sublimed.

10. The process of claim 1 wherein the material to be sublimed is an n-type material and the epitaxial film is made more n-type by lowering the temperature of the material being sublimed.

11. The process of claim 2 wherein the material to be sublimed is an n-type material and the epitaxial film is made more n-type by lowering the temperature of the material being sublimed.

12. The process of claim 3 wherein the material to be sublimed is an n-type material and the epitaxial film is made more n-type by lowering the temperature of the material being sublimed.

13. The process of claim 1 wherein the material to be sublimed is a p-type material and the epitaxial film is made less p-type by lowering the temperature of the material being sublimed.

14. The process of claim 2 wherein the material to be sublimed is a p-type material and the epitaxial film is made less p-type by lowering the temperature of the material being sublimed.

15. The process of claim 3 wherein the material to be sublimed is a p-type material and the epitaxial film is made less p-type by lowering the temperature of the material being sublimed.

* * * * *